United States Patent
Barch et al.

[11] Patent Number: 6,101,457
[45] Date of Patent: Aug. 8, 2000

[54] TEST ACCESS PORT

[75] Inventors: Phillip Thomas Barch, McKinney; Robert Bruce Wong, Carrollton; Stephen James Rice, Richardson, all of Tex.

[73] Assignee: Texas Instruments Incorporated, Dallas, Tex.

[21] Appl. No.: 07/968,632

[22] Filed: Oct. 29, 1992

[51] Int. Cl.[7] .................................................. G01R 31/27
[52] U.S. Cl. ........................................ 702/117; 324/73.1
[58] Field of Search ......................... 364/221; 371/15.1, 371/18, 22.1, 16.1, 27; 324/73.1; 395/325; 702/117

[56] References Cited

U.S. PATENT DOCUMENTS

| | | | |
|---|---|---|---|
| 3,832,535 | 8/1974 | De Vito ................................. | 324/73 R |
| 4,268,902 | 5/1981 | Berglund et al. ..................... | 364/221 |
| 4,428,060 | 1/1984 | Blum ..................................... | 364/715 |
| 4,575,674 | 3/1986 | Bass et al. ............................. | 371/25 |
| 4,698,588 | 10/1987 | Hwang et al. ........................ | 371/25 |
| 4,701,921 | 10/1987 | Powell et al. ........................ | 371/22.3 |
| 4,855,669 | 8/1989 | Mahoney .............................. | 371/25 |
| 4,857,834 | 8/1989 | Sukemura ............................. | 371/15 |
| 4,857,835 | 8/1989 | Whetsel, Jr. .......................... | 371/18 |
| 4,860,290 | 8/1989 | Daniels et al. ....................... | 371/22.3 |
| 4,872,169 | 10/1989 | Whetsel, Jr. .......................... | 371/22.3 |
| 5,005,173 | 4/1991 | Martin .................................. | 371/22.6 |
| 5,103,450 | 4/1992 | Whetsel ................................ | 371/22.3 |
| 5,124,636 | 6/1992 | Pincus et al. ........................ | 324/73.1 |
| 5,285,153 | 2/1994 | Ahanin et al. ....................... | 371/22.1 |

OTHER PUBLICATIONS

"A Survey of Design for Testability Scan Techniques", by E. J. McCluskey, VLSI Design (vol. 5, No. 12, pp. 38–61, Dec. 1984).

*Primary Examiner*—Marc S. Hoff
*Assistant Examiner*—Craig Steven Miller
*Attorney, Agent, or Firm*—Gerald E. Laws; Robert D. Marshall, Jr.; Richard L. Donaldson

[57] ABSTRACT

A test access port for an integrated circuit (or circuits) having a test register and a controller is provided. The controller enables the testability functions that have been selected by the test register. The test register performs the select function and the controller performs the enable function. An integrated circuit, having operation circuitry having nodes and external terminals for input and output of signals during normal operation, a test controller connected to at least a first one of said external terminals for receiving signals and for providing output signals during a test operation, and a test register for containing signals representative of selected tests to be performed connected to said test controller and at least a second one of said external terminals and responsive to said output signals of said test controller for enabling selected tests is provided.

21 Claims, 7 Drawing Sheets

TEST ACCESS PORT

TECHNICAL FIELD OF THE INVENTION

The present invention relates generally to the testing of large scale integrated circuits, and more particularly to methods and apparatus for testing such integrated circuits.

BACKGROUND OF THE INVENTION

As the technology for manufacturing integrated circuits advances, more and more logic functions may be included in a single integrated circuit device. Modern integrated circuit (IC) devices include over 100,000 gates on a single semiconductor chip, with these gates interconnected so as to perform multiple and complex functions, such as, for example, those in a general-purpose microprocessor. The manufacture of such circuits incorporating such Very Large Scale Integration (VLSI) requires that the fabrication of the circuit be error free, as some manufacturing defects may prevent it from performing all of the functions that it is designed to perform. This requires verification of the design of the circuit and also various types of electrical testing after manufacture.

Development of a test program for an IC and debugging of that program can be very time consuming and costly unless designers consider test issues during the logic design phase. Due to the increased complexity of VLSI chips, it is generally not feasible for test engineering to independently develop and debug test programs. The responsibility now lies with logic designers to design logic such that it is easy to test and such that it requires a reduced set of so-called test "vectors" to thoroughly test the design.

However, as the complexity of the circuit increases, so does the cost and difficulty of verifying and electrically testing each of the devices in the circuit. From an electrical test standpoint, in order to totally verify that each gate in a VLSI circuit functions properly, one must ideally be able to exercise each of the gates not only individually (in the digital sense, determining that it is neither stuck-open nor stuck-closed), but also in conjunction with the other gates in the circuit in all possible combinations of operations. This is normally accomplished by automated testing equipment (ATE) that employs test vectors to perform the desired tests. A test vector describes the desired test input (or signals), associated clock pulse (or pulses), and expected test output (or signals) for every package pin during a period of time, often in an attempt to "test" a particular gate (or macro). For complex circuitry, this may involve a large number of test vectors and accordingly a long test time. Macro and cell are used herein to mean the same thing and may be used interchangeably.

In addition, specific circuit configurations in the VLSI circuit may have some of its gates inaccessible for all but a special combination of signals, thereby hiding a fault unless a very specific pattern of signals is presented. However, the cost of performing such testing on 100% of the manufactured circuits is staggering, considering the high cost of the test equipment required to exercise each circuit in conjunction with the long time required to present each possible combination to each gate. This has in the past forced integrated circuit manufacturers to test less than all of the active devices in a chip, with the attendant quality levels of the product being less than optimal. Thus, one of the major problems in integrated circuit design is the ability to adequately test the final IC design, and this problem increases with increasing complexity of the integrated circuit.

One way to address this problem is through design for test (DFT). The key concepts in DFT are controllability and observability. Controllability is the ability to set and reset the state of every node in the circuit, while observability is the ability to observe either directly or indirectly the state of any node in the circuit. The purpose of DFT is to increase the ability to control and observe internal and external nodes from external inputs/outputs. That is, DFT techniques may be employed for logic verification and DC parametric tests.

Designing testability into any circuit will affect the circuitry to some degree. Additional logic will probably have to be added. This additional logic will increase the amount of silicon required to implement the design. The savings from enhanced testability do not usually show up until the development time and testing costs of the circuit and its end system are analyzed.

Circuit designers have used stuck-fault modeling techniques in improving the efficiency of the testing of such VLSI circuits. Stuck-fault modeling is directed not to stuck-open or stuck-closed defects in individual gates, but to the effect of such defective gates (and defective interconnections) resulting in stuck-high and stuck-low nodes of the logic circuit. Minimum patterns of test vectors are then derived for the exercising of the logic circuit. Applying such test vectors to the circuit detects stuck-high and stuck-low nodes if defects are present. Such techniques have been successful in improving the test efficiency of current generation VLSI circuits.

In conjunction with the stuck-fault modeling and associated test generation, other circuitry may be included in the VLSI circuit specifically designed to improving its testability. One type of test circuitry is a scan path in the logic circuit. A scan path consists of a chain of synchronously clocked master/slave latches (or registers), each of which is connected to a particular node in the logic circuit. These latches can be loaded with a serial data stream ("scan in") presetting the logic circuit nodes to a predetermined state. The logic circuit then can be exercised in normal fashion, with the result of the operation (at each of the nodes having a scan latch) stored in its respective latch. By serially unloading the contents of the latches ("scan out"), the result of the particular test operation at the associated nodes is read out and may be analyzed for improper node operation. Repetition of this operation with a number of different data patterns effectively tests all necessary combinations of the logic circuit, but with a reduced test time and cost compared to separately testing each active component or cell and all their possible interactions. Scan paths permit circuit initialization by directly writing to the latches (or registers) and directly observing the contents of the latches (or registers). Using scan paths helps to reduce the quantity of test vectors compared to traditional "functional mode" approaches. Techniques for scanning such data are discussed by E. J. McCluskey in "A Survey of Design for Testability Scan Techniques", VLSI Design (Vol. 5, No. 12, pp. 38–61, December 1984).

Also as VLSI technology is advancing, users of integrated circuits are desiring specially designed and constructed integrated circuits, for performing functions customized for the user's application. Such integrated circuits have been called Application-Specific Integrated Circuits (ASICs). For an ASIC device to be cost-competitive with general purpose microcomputers which may have special functions implemented in programmable firmware, and cost-competitive with a board design made up of smaller scale integrated circuits, the design time of the ASIC circuit must be short and the ASIC circuit must be manufacturable and testable at low cost. Accordingly, it is useful for such circuits to be modular in design, with each of the modules performing a certain function, so that a new ASIC circuit may be constructed by combining previously-designed circuit modules. Such an approach can also be used for non-ASIC microcomputers and microprocessors. Regardless of the end product, the use of a modular approach allows the designer to use logic which has previously been verified, and proven manufacturable. However, if logic modules containing existing scan paths are placed into a new circuit application, new test patterns will generally be required for the new device, thereby lengthening the design/manufacture cycle time.

A modular approach to utilizing scan paths and other testability circuits has been used to provide thorough coverage of all possible faults in an efficient manner. However, this approach utilizes system buses to set up and operate the scan test, so that even though each module is tested independently, the test pattern designed for a given module depends upon the operation of other modules in the logic circuit for purposes of bus control and module selection. This results in the testability of a particular module depending upon the fault-free operation of other modules. In addition, the ATPG program which sets the conditions for test of a given module depends upon the position of the module relative to other modules, and upon the operating features of such other modules. While reduced test times and costs are thus achieved by such modularity, the use of system buses to load and unload the scan paths in the individual modules may not only affect the operation of the particular module, but is likely to also preclude "porting" of the test program for a given module from one logic circuit to another.

Recently, MegaModules have been used in the design of ASICs. (MegaModule is a trademark of Texas Instruments Incorporated.) Types of MegaModules™ include SRAMs, FIFOs, register files, RAMs, ROMs, universal asynchronous receiver-transmitters (UARTs), programmable logic arrays and other such logic circuits. MegaModules™ are usually defined as integrated circuit modules of at least 500 gates in complexity and having a complex ASIC macro function. These MegaModules™ may be predesigned and stored in an ASIC design library. The MegaModules™ can then be selected by the designer and placed within a certain area on the desired IC chip. This allows ASIC designers to integrate MegaModules™ into their logic as easily as simple macros.

Conventionally, these MegaModules™ are available as standard catalog devices and are designed without testability. In order to test the ASIC, a custom test program must be developed for that particular chip. Because a custom testing program has to be devised for each custom chip, the costs associated therewith are greater than desired.

More recently, peripheral cells have been provided for input and output during normal operation of the chip, and also for input and output of testing signals for a testing program. These peripheral cells are typically of input, output, and input/output types. Testing programs have been previously devised that use input cells for the input test terminals and output cells for the output test terminals. This has the disadvantage of restricting the number of test pins of any type to the number of available signal pins of the same type.

Another solution to this testing problem of an ASIC is the use of a so-called Parallel Module Test™ (PMT), which is often referred to as a "direct connect" scheme. (Parallel Module Test is a trademark of Texas Instruments Incorporated.) PMT is a direct connect scheme, because it connects external pins to a MegaModule™ bypassing all other logic, buffers, etc. It is primarily intended as a logic verification testability scheme and has recently been enhanced to address limited VIH/VIL and ICCQ testability schemes. However, even PMT may have problems since the logic states of the ASIC's circuitry may be disturbed as part of the test process during test selection and enabling.

Another solution is the test access port and boundary-scan architecture defined by the IEEE 1149.1 standard, a so-called JTAG test port. IEEE 1149.1 is primarily intended as a system test solution. The IEEE 1149.1 standard requires a minimum of four package pins to be dedicated to the test function. The IEEE 1149.1 standard requires boundary scan cells for each I/O buffer, which adds data delay to all normal operation function pins as well as silicon overhead. Although it has "hooks" for controlling some internal testability schemes, it is not optimized for chip-level testing. IEEE 1149.1 does not explicitly support testing of internal DC parametrics.

For a manufacturer, DC parametrics are just as important to the test process as is logic verification testing, which was described earlier herein. In general, DC parametric tests are employed to evaluate the quality of the fabrication of the individual gates and their interconnections, rather than testing their logical operation as the earlier described tests perform. A test engineer must evaluate the test patterns to find appropriate test vectors where the device is in a state suitable for the performance of DC parametric tests. In conventional logic tests, opportunities for conducting DC parametric tests are scattered throughout the test patterns. What is needed is a simpler, easier, and faster way to generate efficient test patterns useful to perform DC parametric tests.

Many testability schemes have been described that would increase testing quality and/or reduce test time. A partial list includes the disabling of DC through-current for pullup (PU) and pulldown (PD) cells, directing the output of a VIH/VIL tree to a non-dedicated package pin, forcing a high-impedance state for 3-state I/O buffers, and logic verification of MegaModules™ via Parallel Module Test™. However, there is no common control method defined for all these testability schemes.

As a result silicon efficiency is poor, because the control circuit for each testability scheme has its own unique logic and package pin resource requirements. Design and test engineering efficiency is poor, because few of these testability schemes are well-defined and supported by standard testing software. Finally, new testability schemes cannot capitalize on existing silicon, engineering expertise, and software resources.

In addition, there is no common control technique for all of these various known testing schemes. That is, each test scheme has its own control technique. Even JTAG is unable to control all these test schemes without modification.

These and other disadvantages of the prior art are overcome by the present invention, however, and improved methods and apparatus for chip-level testing, as well as system-level testing, are provided.

SUMMARY OF THE INVENTION

In a preferred embodiment, test access port circuitry capable of controlling the testability schemes presently employed to test an ASIC or any other IC is provided. The architecture of the test access port of the present invention is also intended to facilitate control of future testability schemes as they become defined. The test access port of the present invention preferably contains a serial shift register of a preselected length and a controller. The output of each shift register bit position controls an individual facet of a desired testability scheme. The controller interfaces this shift register with the device pins via a simple, yet flexible, protocol for the initialization of the shift register and the enabling of its outputs.

That is, the controller enables the testability functions that have been selected by the signals, data or bits stored in the shift register. The shift register performs the "select" function and the controller performs the "enable" function. The separation of the selection and enable functions builds flexibility and expandability into the test access port of the present invention.

The shift register preferably consists of a plurality of master/slave-based latches hooked together as a shift register. Each latch has a slave data output and a test enable output. The test enable output of each latch controls a unique testability function. That is, logic circuitry to perform a specific test function is selected (or unselected) by a bit or signal in a position of the shift register corresponding to that test function. The shift register bits may be arranged in any order. The latch's test enable output is enabled/disabled by signals from the controller.

One or more testability functions may be required for a particular test. For example, PMT™ tests require enabling the MegaModule™ selected to be tested, plus a series of I/O testability functions. The number of latches employed in the test register is variable, but is preselected depending upon the maximum number and type of test schemes to be employed, which in turn generally depends on the ASIC's or IC's application.

The controller is a state machine that enables/disables the testability functions selected by the signals or information in the test register. Preferably, at least two separate enable signals are generated by the controller. The output of each latch of the test register is controlled by one of the preferred two enable signals generated by the controller. The preferred controller circuitry of the present invention reduces consumption of silicon and routing resources.

One dedicated test pin and four dedicated, or preferably shared, test pins are presently preferred to implement the presently preferred circuitry embodying the test access port of the present invention. A latch isolates each shared test pin from the operation or core logic circuitry when the dedicated test pin has the appropriate signal, which is presently preferred to be a high logic level voltage. Thus, the core logic will not be disturbed by operations at the shared test pins, while the test pin is high. After a test operation, such latches allow for restoration of any signal or logic value that was on the test pins before testing was initiated.

It is an object of the present invention to provide a test access port for ICs.

It is also an object of the present invention to provide a test access port for a system employing ICs.

It is another object of the present invention to provide a test access port architecture that allows utilization of existing test schemes while allowing for utilization of future test schemes as they are developed.

It is yet another object of the present invention to provide methods and apparatus for an improved test access port.

It is also an object of the present invention to provide methods and apparatus for an improved test access port that employ one dedicated test pin and a plurality of shared test pins.

It is further an object of the present invention to provide methods and apparatus that initiate a test feature using signals on only one external pin.

It is yet a further object of the present invention to provide methods and apparatus that employ shared test pins to load test information without disturbing core logic.

These and other objects and advantages of the present invention will become apparent from the following detailed description wherein reference is made to the Figures in the accompanying drawings.

BRIEF DESCRIPTION OF THE DRAWINGS

A more complete understanding of the present invention may be derived by referring to the detailed description and claims when considered in conjunction with the accompanying drawings in which like reference numbers indicate like features throughout the drawings, and wherein:

DETAILED DESCRIPTION

Figure 1:
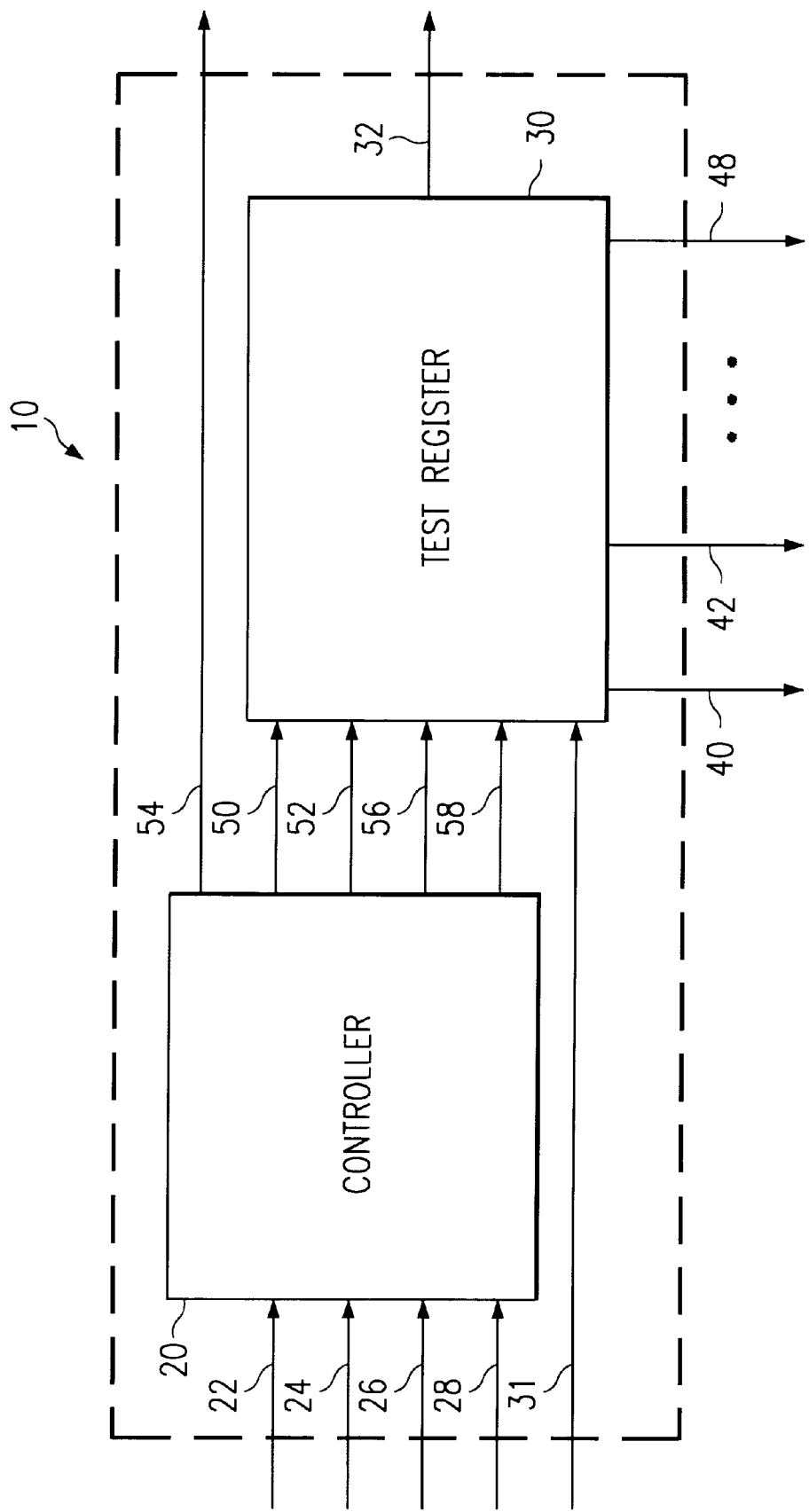
FIG. 1 is a simplified schematic block diagram of an exemplary test access port of the present invention.

Referring now to FIG. 1 there may be seen a simplified block diagram of a test access port 10 of the present invention. More particularly, it may be seen that the test access port 10 of the present invention employs controller 20 and test register 30. Only one package pin 22 must be dedicated to the test function, and it is used to signal the controller 20 of the entry into a test operation or test cycle. Preferably, four additional shared package pins 24, 26, 28, 31 may be used for test functions when the test access port 10 is active, and may also be used for normal operation functions when the test access port 10 is inactive.

The test access port 10 of the present invention is designed to consolidate all ASIC or other IC test methods into a single unified test methodology. The test access port 10 of the present invention may be employed as an ASIC, or any other type of IC, test controller. As depicted in FIG. 1, the test access port 10 requires only one dedicated test pin 22. The test access port 10 is general-purpose, compatible with a wide range of tests, and expandable to accommodate future test needs. The test access port 10 is divided into two basic functional elements. These two elements are test register 30 and controller 20.

Unlike the JTAG port, there is only a very small data delay penalty for the four test/operation function pins 24, 26, 28, 31 and there are no data delay penalties for the remaining normal operation function pins.

Test register 30 preferably consists of a plurality of master/slave-based latches serially connected together as a shift register. A test enable output 40, 42, 48 of each latch controls a unique testability function. That is, logic circuitry to perform a specific test scheme is selected (or unselected) by a bit or signal in a position of the test register 30 corresponding to that test scheme. The positions and test schemes may be arranged in any order. The latch's test enable output 40, 42, 48 is enabled/disabled by signals from the controller 20. The test register 30 of the test access port 10 of the present invention may be initialized without disturbing the state of the core logic or the operation circuit (not depicted in FIG. 1).

The four test/operation function pins 24, 26, 28, 31 are isolated from the operation circuit in a test mode. Latches (not depicted in FIG. 1) may be used to retain the pre-test-mode logic states applied to the operation circuit from the four test/operation function pins 24, 26, 28, 31.

Testability features that may upset the initialization of the operation circuit are preferably not enabled until after the opportunity to initialize the test register 30 has occurred. The pre-test-mode logic states for the four test/operation function pins 24, 26, 28, 31 may be restored when the test register 30 initialization is completed.

The controller 20 is based on a 5-state state machine, as compared to a 16-state state machine defined by the IEEE 1149.1 standard. As a result, the controller protocol of the present invention is simpler and consumes fewer automated test equipment (ATE) test cycles than the IEEE 1149.1 standard. Some preselected testability schemes may be enabled by simply setting the dedicated test package pin 22 high. The same event using the IEEE 1149.1 standard would require at least eight ATE test cycles to invoke. This streamlining becomes important when testability schemes are enabled and disabled frequently. In addition, the presently preferred implementation of circuitry for the controller 20 requires less than 25% of the silicon overhead required to support the IEEE 1149.1 standard's test controller.

Preferably two Test enable states are defined by the test access port 10 (TEST1, TEST2) to provide generic enable or control needs for the present and for "to be defined" testability schemes. From the device pins, the test access port 10 of the present invention can be instructed to enable/disable any combination of the test features of the design. Test features will preferably be controlled by the test access port 10 of the present invention. However, other test controllers may be present (e.g., IEEE 1149.1) and all employed to provide non-overlapping test scheme control.

Figure 2A:
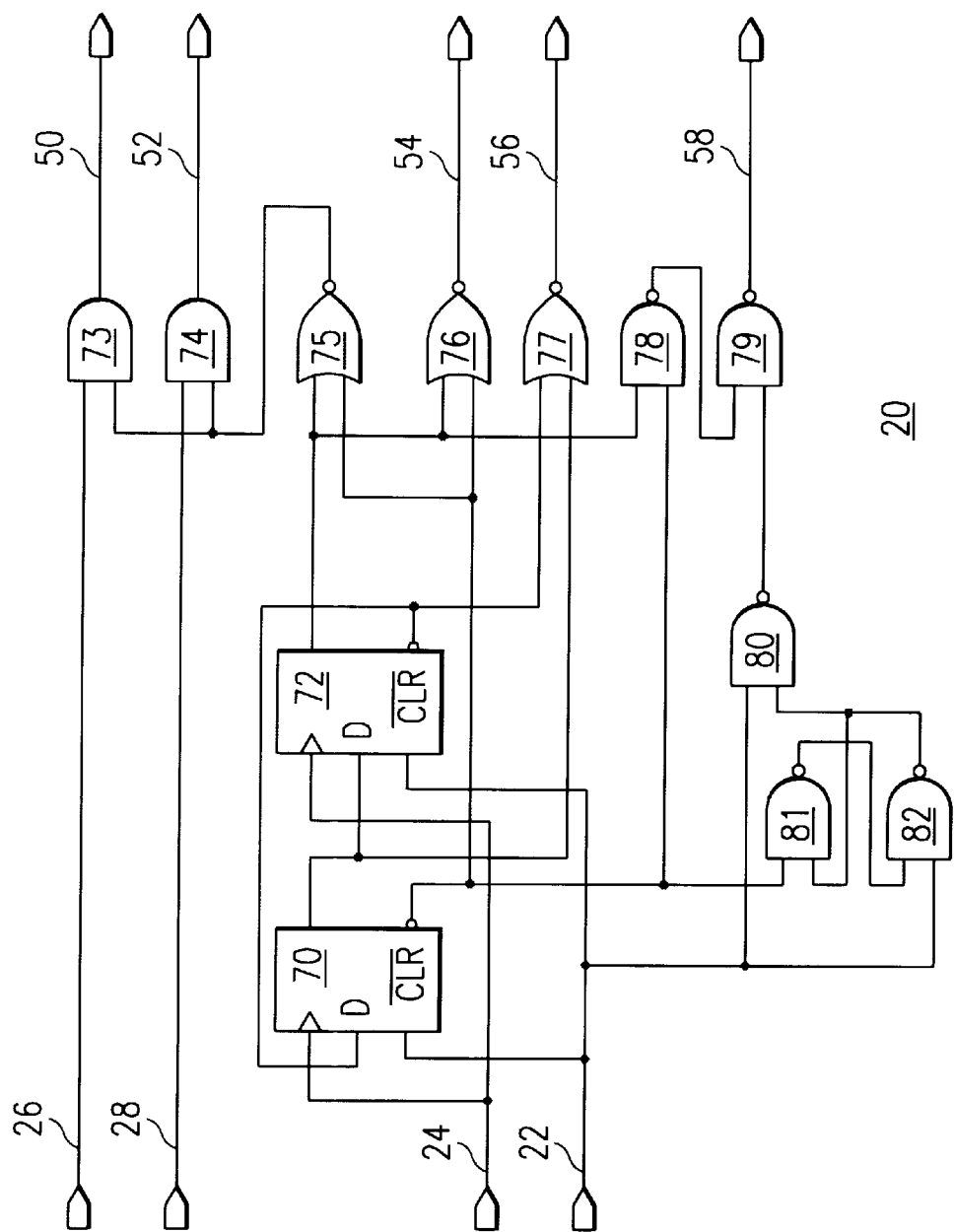
FIGS. 2A and 2B are schematic electrical block diagrams of a controller and an exemplary register of the present invention, respectively.

Referring now to FIG. 2A, there may be seen a simplified block diagram of a controller 20. It may be seen that the controller 20 employs four device pins to receive four signals: TEST on pin 22, SCAN_IRL on pin 24, MAS_CLK on pin 26, and SLA_CLK on pin 28. Only the pin 22 is dedicated to the TEST signal, the rest may preferably be shared to have normal input functions when the TEST signal is low and assume controller input functions only when the TEST signal is high. Again, pin 22 is preferably the only dedicated test pin; when this pin 22 is low, the test access port 10 is in its normal or inactive mode, and when this pin 22 is high a test mode or test operation is entered. For the signal SCAN_CTRL pin 24 may preferably be a shared test pin; while TEST is low, pin 24 behaves only as a normal input pin, but when TEST is high, pin 24 behaves only as a controller input pin, where low-to-high transitions on this pin 24 change the state of the controller 20, as described more fully later herein. For the signal MAS_CLK pin 26 may preferably be a shared test pin; while TEST is low, pin 26 only behaves as a normal input pin, but when TEST is high, pin 26 behaves only as a controller input pin, where a low level holds each master latch (not depicted in FIG. 2A) of the test register 30, and a high level passes data through each master latch of the test register 30. For the signal SLA_CLK pin 28 may preferably be a shared test pin; while TEST is low, pin 28 behaves only as a normal input pin, but when TEST is high, pin 28 behaves only as a controller input pin, where a low level holds each slave latch (not depicted in FIG. 2A) of the test register 30, and a high level passes data through each slave latch of the test register 30.

Although depicted as having one dedicated pin 22 and three shared pins 24, 26, 28, the controller 20 of the present invention may employ fewer shared pins, as desired by the IC designer. The use of only one dedicated test pin to select the test mode, combined with the use of a plurality of shared pins to provide the requisite signals to a controller 20 and associated test register 30, is considered to be within the scope of the present invention. Similarly, sharing may be employed on selected output pins and still be within the scope of the present invention, but output pin sharing does not impact nor alter controller 20 functions.

Continuing to refer to FIG. 2A, it may be seen that the preferred controller circuit employs two flip-flops 70, 72, two AND gates 73, 74, three NOR gates 75, 76, 77, and five NAND gates 78, 79, 80, 81, 82. For pin 22, when TEST goes low it clears the two flip-flops 70, 72. Pin 24 may be used to connect the signal SCAN_CTRL to the clock input of the two flip-flops 70, 72. As may be seen from this circuit, a first test signal 58 (TEST1) is output when TEST goes high. This signal is provided to and used by test register 30, as described later herein. When TEST is high and SCAN_CTRL changes low to high, the state of the controller 20 is changed to the next logical state as described more fully later herein. In addition, a second test signal 56 (TEST2) may be generated by the circuit when TEST has stayed high and SCAN_CTRL has been pulsed the appropriate number of times. In addition, when TEST is high and the controller 20 has been shifted to its WRITE state, a signal 54, TEST WRITE ENABLE, is high and two clock signals 50, 52 (GTT, GST) are generated to clock the data bits on pin 31 (not depicted in FIG. 2A), used for SCANIN signals, into test register 30 (not depicted in FIG. 2A). When the controller 20 is in the WRITE state no tests are enabled, so that data may be scanned in without affecting the core logic or operation circuitry. The state of controller 20 must be changed from WRITE to perform a selected test.

Figure 2B:
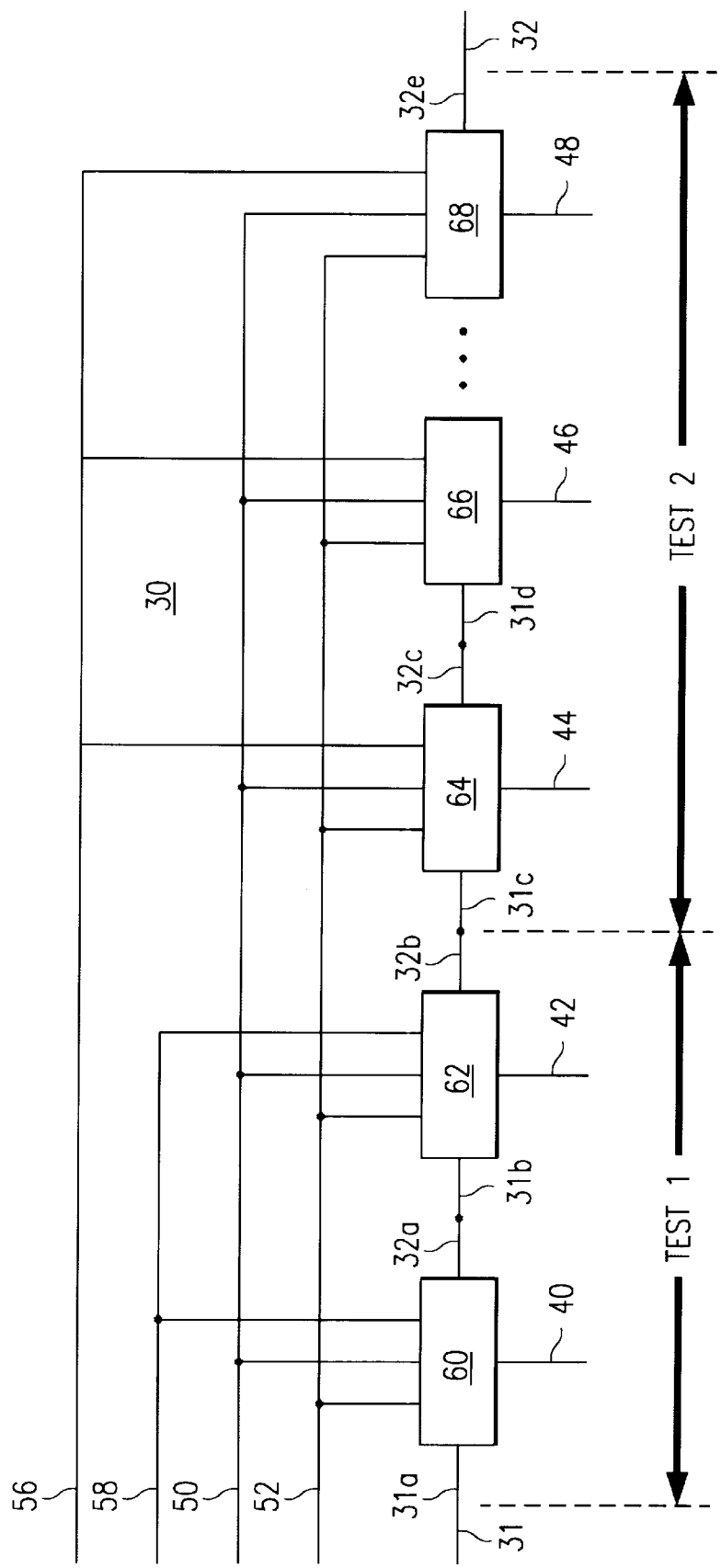

Referring now to FIG. 2B, there may be seen a simplified block diagram of a test register 30. It may be seen that the test register 30 is an n-bit serial shift register, with each bit enabling an individual test feature, or testability function. Each desired or preselected testability function is controlled by its own bit in test register 30, resulting in more flexibility than control schemes having one bit controlling multiple test features. Test register 30 is preferably composed of master-slave latches with an output enable control. Pin 31 may be a shared test pin that is connected directly to the scan in line 31*a* of the first latch 60 of the test register 30 to supply the SCANIN signal; while TEST is low, pin 31 behaves only as a normal input pin, but when TEST is high, pin 31 behaves only as a test access port input pin, and it provides the input SCANIN signals to the first latch 60, via scan line 31*a,* of the test register 30.

As illustrated in FIG. 2B, the latches are chained together by connecting the scan in line 31*b* of the next latch in the chain to the scan out line 32*a* of the previous latch in the chain. The test register 30 is loaded by shifting n bits into the n latches 60, 62, 64, 66, 68 corresponding to the test schemes desired to be implemented. Similarly, a shared pin 32 may be employed to provide SCANOUT signals and thereby to read out the contents of the test register 30, if desired. A TEST WRITE ENABLE signal, on line 54 (see FIG. 2A), may be employed to control a multiplexer (not depicted in FIG. 2B) to provide the SCANOUT signals on line 32 to a shared pin.

Most of the remaining input signals (GTT 50 and GST 52) for latches 60, 62, 64, 66, . . . , 68 are connected in parallel to the latches that make up the test register 30. However, the latch outputs (40, 42, 44, 46, . . . , 48) are enabled by either the TEST1 58 or TEST2 56 signal. The test register 30 can also be interpreted as a test instruction register. Thus, each ASIC or IC test is selected by an n-bit code. Its serial nature economizes ASIC or IC resources (gates and interconnects). A control signal (MSEL) 40, 42, 44, 46, . . . , 48 from each latch 60, 62, 64, 66, . . . , 68, respectively, of the test register 30 will be connected to the appropriate ASIC or IC test logic and/or structures.

Figure 3:
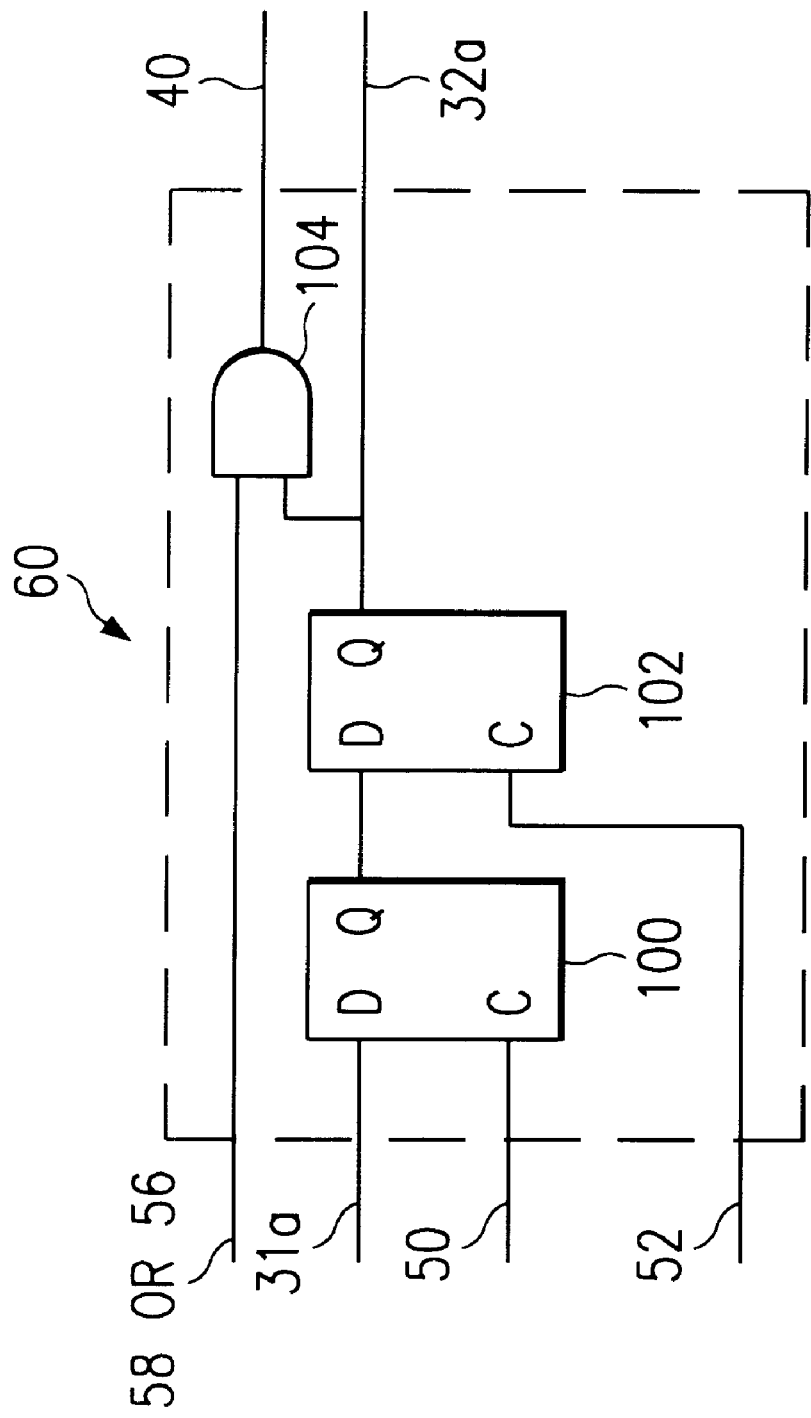
FIG. 3 is a more detailed schematic electrical diagram of the internals of a latch from which the register of FIG. 2B may be constructed.

Referring now to FIG. 3 there may be seen an internal circuit for a latch, for example the first latch 60, preferably employed to make up the test register 30 of the present invention. This latch is preferably a macro in an ASIC library so that the register 30 contains the number of latches corresponding to the number of test schemes desired to be implemented. The latch 60 employs a master latch 100 and a slave latch 102 and a two-input AND gate 104. The scan in line 31a is connected to the data pin of the master latch 100. The Q output of the master latch 100 is the data input (D) of the slave latch 102. The master 100 and slave 102 latches shift data from one latch 60 in the chain to the next latch 62 in the chain. Correct application of GTT 50 and GST 52 clock signals, both from the controller 20, can ensure error-free shifting regardless of clock skew.

As noted in FIG. 2B earlier herein, the scan out line 32a of one latch 60 is connected to the scan in line 31b of the next latch 62 in the chain or sequence. The first scan in line 31a in the chain will ultimately be connected to a shared device pin, i.e. pin 31, and receive SCANIN signals. The last scan out line 32e in the chain may be connected to a shared device pin, i.e. pin 32, for outputting SCANOUT signals. The control signal (MSEL) 40, 42, 44, 46, 48 from each latch of the test register 30 will be connected to the appropriate ASIC or IC test logic and/or structures. MSEL 40, 42, 44, 46, . . . 48 will be enabled by either TEST1 58 or TEST2 56, both of which come from the controller 20. The other latches of the test register 30 operate in an analogous manner.

As described herein, the controller 20 is the main interface between the external terminals or device pins and the test register 30. As noted earlier, the controller is preferably connected to at least one of the external terminals and the test register 30 is also preferably connected to an external terminal that is different from the terminals connected to the controller 20. The controller 20 also controls test function sequencing by acting as a state machine. Although the test register 30 selects the test feature or function to be performed, the controller 20 generates the signal(s) that enables the selected test or tests. That is, the test register 30 contains signals representative of selected tests to be performed and is responsive to output signals from the controller 20 for enabling selected tests.

Thus, the present invention provides a method for testing an integrated circuit. The method detects a first signal on the integrated circuit to shift to a test operation, and then detects at least one stored signal when the first signal is detected. The at least one stored signal corresponds to at least one preselected test; that is, the stored signals correspond to or represent the preselected tests to be performed. The preselected test (at least one) is then performed on a portion of the integrated circuit.

Preferably, as noted earlier herein the test access port 10 of the present invention utilizes only five device pins to receive the signals: TEST, SCAN_CTRL, MAS_CLK, SLA_CLK, and SCANIN. The results of any test may be detected on other existing normal pins or other normal pins shared to also serve as test pins during a test operation. Only the pin for the TEST signal is dedicated; the remaining (four) pins preferably may be shared to have normal input (or output) functions. Shared input pins assume controller input functions only when TEST is high. The operation of these preferred five pins has been described earlier herein.

Figure 4:
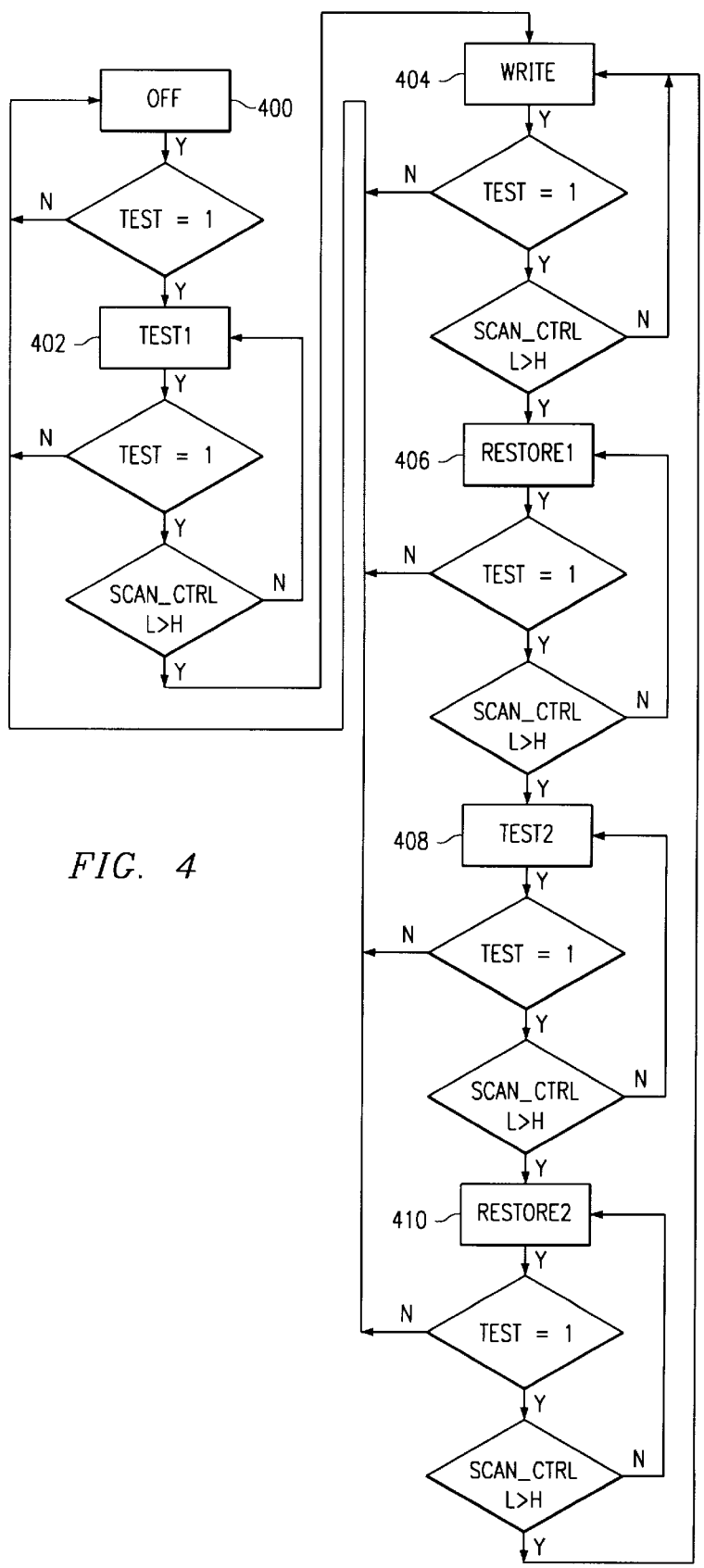
FIG. 4 is a simplified state diagram of the states of the controller of the present invention.

Referring now to FIG. 4, there may be seen a simplified state diagram of controller 20. When the TEST signal on pin 22 is low, the test access port device 10 of the present invention will be in the OFF state 400. By setting the TEST signal on dedicated pin 22 high, the controller 20 leaves the OFF state 400 and is in the TEST1 state 402. As depicted in FIG. 4, this is by a "decision" diamond of, "is TEST high?" (i.e. is "Test=1", with a Yes ("Y") or No ("N") result.) The controller 20 may be cycled through the remaining four states, WRITE 404, RESTORE1 406, TEST2 408, and RESTORE2 410, by toggling the SCAN_CTRL signal on pin 24 low-to-high (i.e. a diamond containing "SCAN_CTRL L →H") four times, as depicted by the decision diamonds and lines between these states with TEST remaining high. At any time during any of these states, returning the TEST signal on pin 22 low will exit the test operation, via a decisional "Test=1", "N" (No) line.

Upon entering a test operation (TEST high), the test access port 10 input signals (excluding TEST) are preferably internally "latched" into the core. Thus the core logic continues to see the last normal pin values. This isolates the core logic from any controller signals. These core signals remain latched until TEST returns low. While latched, the test access port 10 may employ the shared test pins in any manner without disturbing the core logic.

Preferably, the test access port 10 operates in two distinct testing levels, e.g. TEST1 & TEST2. These two levels serve to better define and control the testing environment. The TEST1 state is a very mild test condition. The basic device state remains unchanged. Minor test functions are enabled, such as, for example, but not limited to disabling pullup and pulldown cells, VIH/VIL output enable, and SRAM "standby" mode. All other device pins remain in normal mode.

On the other hand, the TEST2 state is the more serious test condition. The basic device state may change as a result of performing one of the tests enabled by the TEST2 state. Other device pins may be forced to change directions. TEST1 schemes or features are also preferably enabled during the TEST2 state.

The WRITE state 404 permits writing of data to the test register 30. Only the test access port signals, TEST on pin 22, SCANIN on pin 31, SCAN_CTRL on pin 24, GTT on pin 26, GST on pin 28 and SCANOUT on pin 32 should be active; all remaining device pins will remain in normal mode. Because the signals on the input pins of the controller were internally latched on entering test mode, loading the test register 30 will not disturb the device state.

The RESTORE1 state 406 permits the controller pins to return to pre-test-mode normal values without affecting the test register 30 or the core logic following a WRITE state 404. The RESTORE2 state 410 also permits the controller pins to return to pre-test-mode normal values without affecting the test register 30 or core logic following the TEST2 state 408.

Continuing to refer to FIG. 4, the operation of the test access port 10 will be described by reviewing the controller states, power up concerns, and how to rewrite to the test register 30. The controller 20 state descriptions are as follows:

| State | Description |
|---|---|
| 1) OFF 400 | All test access port-controlled testability functions are disabled. The test access port 10 does not affect the functionality of the operation circuit. |
| 2) TEST1 402 | All TEST1 testability functions selected by the test register 30 are enabled. |
| 3) WRITE 404 | The MAS_CLK and SLA_CLK signals are allowed to pass through the controller 20 to the test register 30, permitting initialization. All TEST1 and TEST2 testability functions are disabled. Since the operation logic is isolated from the shared pins when TEST is high, the test register 30 initialization will not change the operation circuit initialization. The desired testability functions are preferably selected by loading a "1" into the appropriate latch of the test register 30. All test register 30 latches must be initialized during the WRITE operation. The test register 30 will remain initialized until the device is powered down or it is re-initialized. |
| 4) RESTORE1 406 | The shared pins are isolated from both the operation circuit and the test register. This state permits the restoration of logic states (that existed prior to the test register 30 initialization sequence) to the shared pins without upsetting the initialization of the operation circuit or test register 30. Care must be taken when restoring from the TEST1 state to prevent an accidental additional rising edge from the SCAN_CTRL line. This state allows for restoration of the device test pins to the pre-test-mode values existing in the prior OFF state. |
| 5) TEST2 408 | All selected TEST2 (and optionally TEST1) testability features selected by the test register 30 are enabled. |
| 6) RESTORE2 410 | This state is functionally the same as RESTORE1. |

The contents of the test register 30 are unknown when the device powers up. If some incompatible testability features were enabled simultaneously because of the test register's power up state, potential damage might be inflicted on the circuit. An example of such an instance is where several MegaModule™ drive a common test data bus. Therefore the test access port 10 of the present invention includes the capability to initialize the test register 30 before enabling any of the testability features that could potentially damage the circuit to be tested.

The TEST2 category of testability features addresses this powerup concern. Since the TEST2 enable state only occurs after the WRITE state in the controller 20 protocol, an opportunity exists to initialize the test register 30 prior to enabling the TEST2 testability features.

The test access port 10 of the present invention was designed to permit test register 30 initialization without disturbing the operation circuit initialization. Two things help achieve this. First, the shared test pins are isolated from the operation circuit when the TEST signal on pin 22 is high. Second, the RESTORE state allows the pre-existing shared pin states to be restored without affecting the operation circuit's initialization or the test register 30 initialization. Therefore the test register 30 may be initialized repeatedly within a test pattern set without upsetting the operation circuit initialization.

Whenever TEST is high, the shared test pins or external terminals are isolated from the nodes of the operation logic by a latch located at a node for the operation circuitry. In this manner, any signals on the pins are provided to the test circuitry but not to the nodes of the operation circuitry. In addition, if a 3-state buffer is employed as an isolation means instead of the preferred latch, then busholders are connected to the shared nodes to retain the last state at the node prior to TEST going high (or entry into a test operation). Thus, various types of isolation means may be employed to isolate test pins from core logic or operation circuitry during a test mode or test operation. That is, the isolator decouples the test pin from operation circuitry so that the test pin only interfaces with other circuitry.

The initialization of the test register 30 requires the controller 20 to be set to the WRITE state. Test data is shifted in to all the test register 30 latches for each WRITE operation.

Continuing to refer to FIG. 4, a test register WRITE operation does not upset the initialization of the operation circuit. When TEST is high, the shared inputs (SCAN_CTRL, SCANIN, MAS_CLK, SLA_CLK) are isolated from the operation logic and latches (or busholders) retain the last states applied while TEST was low. A RESTORE state permits the restoration of test pin states that existed prior to TEST going high to maintain the operation circuit logic initialization or state when TEST is set low. The test register 30 remains initialized when the device returns to normal mode.

The states of FIG. 4 and their sequence are illustrative of one way to configure the state machine of the present invention. Other states and/or sequences may be so employed and still be within the scope of the present invention.

The following steps illustrate how to set the controller 20 of FIG. 2A to the WRITE state and input data into the test register 30 and briefly describe their effect.

1) Set TEST from a low state to a high state. This isolates the shared inputs (SCAN_CTRL, SCANIN, MAS_CLK, SLA_CLK) from the operation logic.
2) Set SCAN_CTRL, MAS_CLK, and SLA_CLK to a low state.
3) Apply rising edge #1 to SCAN_CTRL. WRITE mode has been enabled.
4) Set SCAN_CTRL to a low state.
5) Set SCANIN to the desired state for each test register latch, one at a time, starting with the least significant latch (the latch connected farthest away from the SCANIN pin 31). Simultaneously, the data in each latch of the test register is shifted out of the register on output pin 32, as a SCANOUT signal.
6) Using data logic states, assemble and apply a return-to-zero clock to MAS_CLK and SLA_CLK to shift in the SCANIN state to the test register. Note that MAS_CLK precedes SLA_CLK and the clocks must not overlap.
7) Repeat steps 5–6 until the test register has been completely initialized.
8) Apply rising edge #2 to SCAN_CTRL. RESTORE1 state has been enabled. RESTORE1 and RESTORE2 represent two states in FIG. 4. They are functionally identical. SCAN_CTRL does not automatically return to zero.
9) Set SCAN_CTRL, SCANIN, MAS_CLK, SLA_CLK, to desired pre-test values.

10) Set TEST low, normal device mode is now enabled. The test access port 10 is inactive.

The following steps illustrate how to set the test access port 10 to the TEST1 state. Generally, the TEST1 state is used to invoke testability features that cannot, by themselves, upset the initialization of the device. Examples of the testability features that are presently believed to be in this category are: 1) PU/PD turnoff, 2) SRAM "standby" mode, and 3) select NAND-tree data. It is assumed that test register 30 has already been initialized with the desired TEST1 test features to be selected.

1) Set TEST from a low state to a high state. TEST1 has been enabled. The desired tests may then be performed.
2) Set TEST to a low state. Normal device mode is now enabled; the test access port 10 is inactive.

The following steps illustrate how to set the test access port 10 to the TEST2 state. Generally, the TEST2 state is used to invoke testability features that may, but not necessarily, upset the initialization of the device. Examples of the testability features that are presently believed to be in this category are: 1) I/O HIGH IMPEDANCE(Z), 2) PMT I/O, and 3) MegaModule [0, . . . , n] Select. The TEST2 state may also optionally invoke some or all the TEST1 testability features selectable by the test register 30.

1) Set TEST from a low state to a high state.
2) Set SCAN_CTRL, MAS_CLK, and SLA_CLK to a low state.
3) Apply rising edge #1 to SCAN_CTRL. WRITE has been enabled. This procedure assumes the test register 30 has already been initialized so a test register WRITE operation will not be illustrated.
4) Set SCAN_CTRL to a low state.
5) Apply rising edge #2 to SCAN_CTRL. RESTORE1 state has been enabled. RESTORE1 and RESTORE2 represent two states in FIG. 4. They are functionally identical.
6) Set SCAN_CTRL to a low state.
7) Apply rising edge #3 to SCAN_CTRL. TEST2 has been enabled. The desired tests then may be performed.
8) Set SCAN_CTRL to a low state.
9) Apply rising edge #4 to SCAN_CTRL. RESTORE2 is then enabled. SCAN_CTRL does not automatically return to zero.
10) Set shared input pins (SCAN_CTRL, MAS_CLK, SLA_CLK, and SCANIN) to desired values.
11) Set TEST to a low state. Normal device mode is now enabled; the test access port is inactive.

Each test register bit controls an ASIC or IC test feature. One exemplary set of ASIC test features is identified in Table 1.

TABLE 1

| TEST | TYPE | FUNCTION |
| --- | --- | --- |
| PU/PD_TURNOFF | TEST1 | Turn off pullups and pulldowns |
| $V_{IH}/V_{IL}$ | TEST1 | Enable $V_{IH}/V_{IL}$ output |
| SRAM-STANDBY | TEST1 | Set SRAM to "Standby" mode |
| I/O HI-Z | TEST2 | I/O disable (set high-impedance) |
| PMT_I/O | TEST2 | Enable parallel module test I/O paths |
| MSELA | TEST2 | Scan chain #1 select |
| . | . | . |
| . | . | . |
| . | . | . |

TABLE 1-continued

| TEST | TYPE | FUNCTION |
| --- | --- | --- |
| MSEL1 | TEST2 | MegaModule #1 select |
| . | . | . |
| . | . | . |
| . | . | . |
| MSELN | TEST2 | BIST #1 select |
| . | . | . |
| . | . | . |
| . | . | . |
| MSELT | TEST2 | Expansion |
| . | . | . |
| . | . | . |
| . | . | . |

After manufacturing, all ASIC or IC devices must be tested. Typically, functional test vectors are used. Testing an embedded MegaModule™ with functional test vectors may be difficult or impossible. MegaModules™ may be deeply "buried" within logic. Many functional test vectors may be required for just one MegaModule™ access. MegaModules™ cannot be efficiently tested this way.

Parallel Module Test™ (PMT) is one way to efficiently test MegaModules™. PMT directly accesses the MegaModules™ from the device pins, bypassing the intermediate logic. PMT permits efficient communication with MegaModules™ (in parallel as opposed to serial). Preferably, a suite of PMT test vectors is provided for those MegaModules™ included in a design library.

Figure 5:
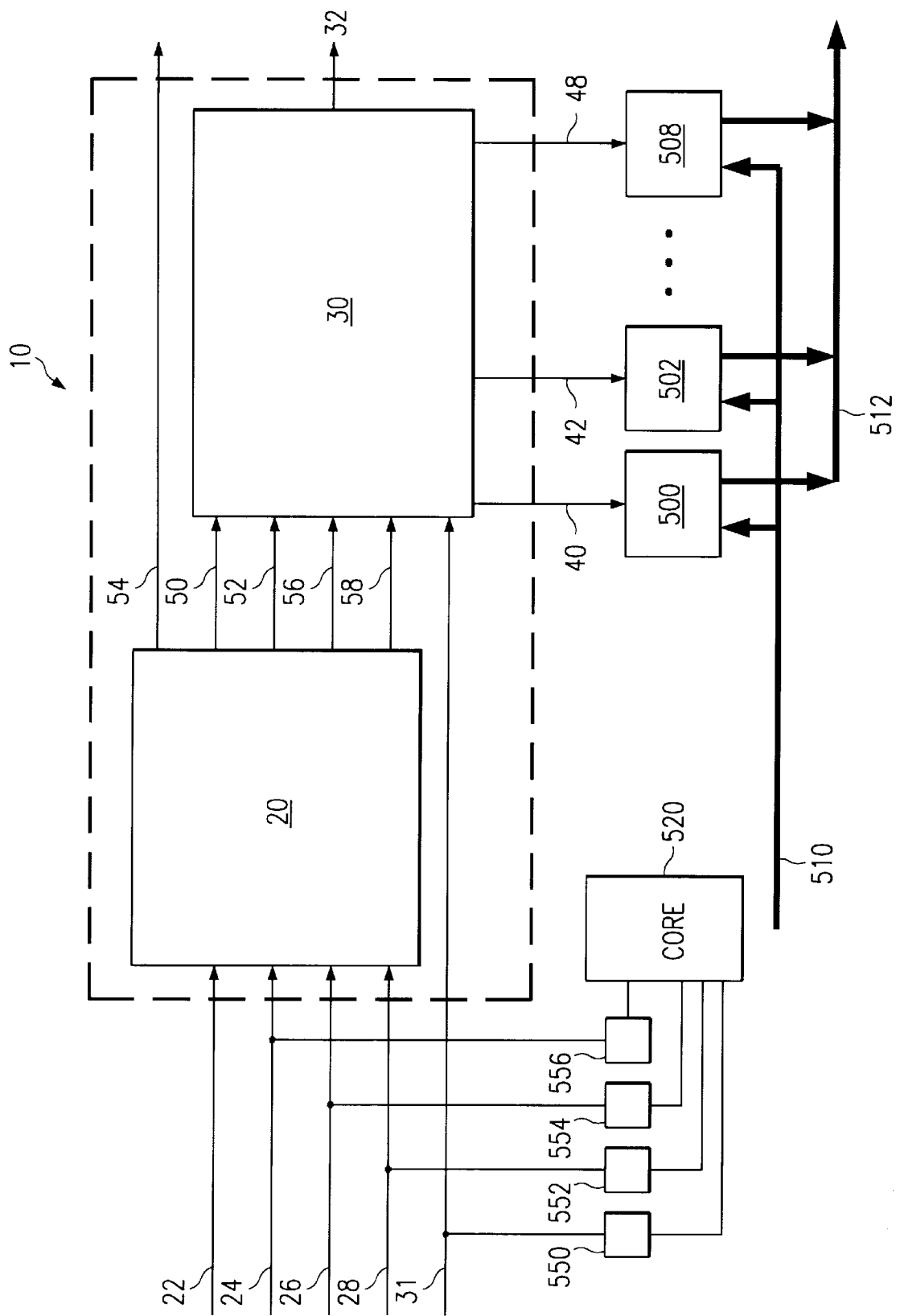
FIG. 5 is a simplified block diagram of the test access port of the present invention employed to perform PMT™ on MegaModules™.

As depicted in FIG. 5, the test access port 10 of the present invention may be employed to control an ASIC PMT test. The test access port 10 of the present invention may also be employed as a general-purpose test controller built into an ASIC or IC device. PMT mode can be activated and deactivated through test access port 10. Continuing to refer to FIG. 5, there may be seen a plurality of n modules 500, 502, . . . , 508, each of which is connected to a module test input bus 510 and a module test output bus 512. In addition, core logic 520 may be seen with isolation means 550, 552, 554, 556 for isolating nodes of the core logic 520 from the signals on the shared pins 24, 26, 28, 31. The isolator means 550, 552, 554, 556 also serve to capture and present the last value before TEST went high to the core logic 520. For ease of illustration purposes, the normal interconnections between the modules 500, 502, 508 and core logic 520 are not depicted in FIG. 5.

For MegaModule™ functional tests, the test access port 10 will select the target MegaModule™ and enable the Parallel Module Test™ (PMT) test signal paths from the Megamodule™ to the package pins. For SRAM ICC measurements (read/write mode), the test access port will remove the influence of pullup/pulldown through-current. Whenever PMT I/O is enabled, all PMT test I/O paths are enabled, not just the ones used by the selected MegaModule™.

The SCAN_CTRL signal on pin 24 cannot be used as a PMT test I/O during a test operation because rising edges on this pin while TEST is high would advance the state of the controller 20.

Some testability features may need to be repeated, such as, for example, NAND-trees, MegaModules™, Built in Self Test (BIST) structures, and scan paths. The architecture of the test access port 10 of the present invention supports this by viewing each instance of a testability feature as unique. So if there were several NAND-tree data outputs, the test register 30 would have several latches for the "Select NAND-tree #0 Data" through "Select NAND-tree #n Data" testability features.

The target MegaModule™ is selected by its corresponding "MegaModule Select" test register latch. When a "1" is written to this latch and the test access port 10 is set to TEST2 mode, the target MegaModule™ is set to test mode. Note that each MegaModule™ has its own "MegaModule Select" test register latch and that only one target MegaModule™ may be selected at a time.

The PMT I/O path control signal is generated by the "PMT I/O" test register latch (not depicted in FIG. 5). For 3-state buffers, this test signal may be ORed with the normal operation high-impedance control signal from the normal operation circuit. For ECL buffers the test signal inhibits the ECL to/from CMOS voltage translation within the buffer and enables a path between the bond pad and the MegaModule™ test signal by means of a normally off, on/off "pass" gate. When a "1" is written to this latch and the test access port 10 is set to "TEST2" mode, all PMT I/O paths for all MegaModules™ are enabled simultaneously.

Figure 6:
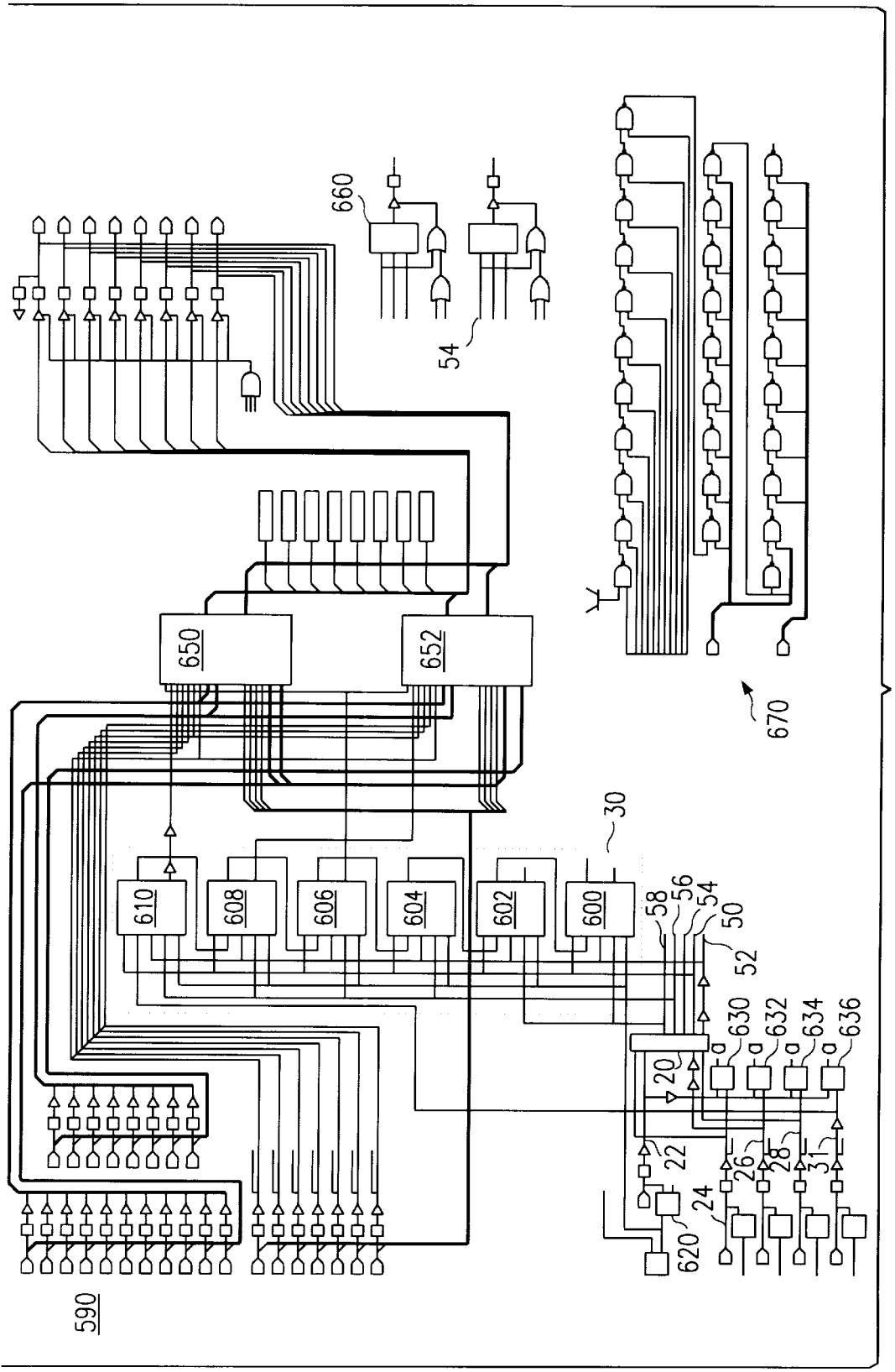
FIG. 6 is a simplified block diagram depicting the test access port of the present invention in an exemplary integrated circuit.

Referring now to FIG. 6, there may be seen an exemplary IC circuit 590 containing the test access port 10 of the present invention. More particularly, there may be seen controller 20 and test register latches 600, 602, 604, 606, 608, 610, that make up a test register 30. In addition, a pull down (PD) cell 620 is shown connected to the dedicated pin 22. Isolation latches 630, 632, 634, 636 are shown connected to the shared pins 24, 26, 28, 31 and provide a way to store the value of the signal on that pin when a test operation is entered and continue to present that value to the operation circuitry, via lines "a", so as not to upset its initialization state, as well as isolate the pin from a node of the operation circuitry 650, 652. Thus, the values on the shared pins are remaining elements of the circuit in FIG. 6 are not important to understand how the test access port 10 of the present invention is connected to and interfaces with the operation circuit.

For 3-state output and bidirectional buffers, one signal from the test access port 10 may be used to force all of them to their high-impedance state, making DC parametric test pattern generation less reliant on functional initialization.

The test high impedance control signal for all 3-state output and bidirectional buffers may be ORed with the normal operation control signal and is generated by the "I/O HIGH Z" test register latch. When a "1" is written to this latch and the test access port is set to TEST2 mode, all 3-state output and bidirectional buffers are set to their high-impedance state. This feature may be used to assist test pattern development for DC parametric test opportunities.

The test access port 10 of the present invention greatly eases the ICCQ test task for circuits with pullups/pulldowns (PU/PD) or SRAMs, because the DC through-current cells do not have to be turned off by functional initialization. The ICCQ test measures unintended (or leakage) current through a device when it is quiescent; such leakage current may indicate fabrication defects. Similarly, an ICC test measures the expected DC through-current of a device in a quiescent state. Both of these types of current tests may be easily implemented by the test access port 10 of the present invention. For example, when the test register is initialized as shown in Table 2, the ICCQ test may be performed at any valid ICCQ test vector simply by setting the test access port 10 to its "TEST1" mode.

TABLE 2

| | TEST REGISTER | | | | | | | | |
|---|---|---|---|---|---|---|---|---|---|
| | TEST1 | | | TEST2 | | | | | |
| ASIC TEST | PU/PD_TURNOFF | $V_{IH}/V_{IL}$ | SRAM STANDBY | I/O HI-Z | PMT_I/O | MSELA | MSELI | MSELN | MSELT |
| ICCQ | 1 | 0 | 1 | 0 | 0 | X | X | X | X |
| $V_{IH}/V_{IL}$ | 0 | 1 | 0 | 1 | 0 | X | X | X | X |
| $I_{IH}/I_{IL}/I_{OZ}$ | 1 | 0 | 0 | 1 | 0 | X | X | X | X |
| PU/PD | 0 | 0 | 0 | 1 | 0 | X | X | X | X |
| $V_{OH}/V_{OL}$ | 1 | 0 | 0 | 0 | 0 | X | X | X | X |
| Scan chain #1 | 1 | 0 | 0 | 0 | 0 | 1 | 0 | 0 | 0 |
| . | . | . | . | . | . | . | . | . | . |
| . | . | . | . | . | . | . | . | . | . |
| . | . | . | . | . | . | . | . | . | . |
| PMT, MM #1 | 1 | 0 | 0 | 0 | 1 | 0 | 1 | 0 | 0 |
| . | . | . | . | . | . | . | . | . | . |
| . | . | . | . | . | . | . | . | . | . |
| . | . | . | . | . | . | . | . | . | . |
| BIST #1 | 1 | 0 | 0 | 0 | 0 | 0 | 0 | 1 | 0 |
| . | . | . | . | . | . | . | . | . | . |
| . | . | . | . | . | . | . | . | . | . |
| . | . | . | . | . | . | . | . | . | . |
| Expansion | 1 | 0 | 0 | 0 | 0 | 0 | 0 | 0 | 1 | seen only by the controller 20 when TEST is high on pin 22. Note that the shared pins or external terminals are connected to both the isolation latch and the test access port 10. The isolation latches in turn are connected, via lines "a", to nodes of the operation circuitry 650, 652.

Blocks of RAM 650, 652 are depicted in FIG. 6 as the operation circuitry. A two-to-one multiplexer 660 is employed to determine if the output of a VIH/VIL NAND tree 670 is provided as an output of the circuit 590. This technique is employed to minimize the number of dedicated test pins for the circuit. The details of the operation of the For buffers with pullups or pulldowns, the test access port 10 makes input/output DC leakage current tests possible by turning off the pullup/pulldown through-current. Preferably, a pulldown cell 620 is connected to TEST pin 22 and is always turned on (i.e. not disabled by "PU/PD-turnoff"), to avoid any inadvertent entry into a test operation.

The turn off control signal for all pullup/pulldown cells is generated by the "PU/PD turnoff" test register latch. The standby mode control signal for all SRAMs is generated by the "SRAM standby mode" test register latch and may be ORed with the operation circuit's normal SRAM control signal. When a "1" is written to both of these latches and the test access port 10 is set to TEST1 (or TEST2) state, all pullup/pulldown cells and SRAM DC through-current are turned off.

The turn off control signal for all pullups/pulldowns is generated by the "PU/PD turnoff" test register latch. When a "1" is written to this latch and the test access port 10 is set to TEST1 (or TEST2) mode, all pullup/pulldown cells are turned off.

The test access port 10 may be employed to remove the influence of PU/PD through-current during a VOH or VOL DC measurement. However, functional initialization may still be required to achieve the needed VOH/VOL states.

The test access port 10 may also be used to direct the output data from a NAND-tree to an output buffer during the VIH/VIL test. It may also be used to set 3-state output and bidirectional buffers to the high-impedance state to assist in test pattern development.

A 2:1 multiplexer 660 may be used to select between the NAND-tree output data and operation or core logic data. The multiplexer's output drives the input of an output buffer. The multiplexer select control signal is generated by the "Select NAND-tree data" test register latch. When a "1" is written to this latch and the test access port is set to TEST1 (or TEST2) mode, the NAND-tree's output data is directed to the output buffer.

One primary objective of the test access port 10 architecture of the present invention is to be powerful enough and flexible enough to facilitate new testability schemes as they are developed and come into demand. This objective is met by constructing a test register 30 to controllably select individual test features and a controller 20 to enable each selected test feature with one of two "levels" of an enable protocol.

One or more test register latches must be initialized with a "1" to select a given testability scheme. For example, just one test register latch is required to control pullup/pulldown through-current, i.e., PU/PD turnoff. Two test register latches are required to select PMT, one to select the individual MegaModule™ and a second to enable PMT test data I/O. Not only can test features be selected by simply adding more latches to the test register 30, it is also possible to assign multiple test register latches to a given testability scheme, if it is desirable.

Examples of three possible future testability schemes are: 1) Built-in Self Test (BIST), 2) Internal Scan, and 3) Multiple NAND-trees. Although TEST1 or TEST2 enable assignments are provided for some of these schemes in Tables 1 and 2 for illustrative purposes, such assignments are by way of example and are not addressed at this time.

Thus, the present invention provides a method for testing an integrated circuit. The method generates a first test signal to start a test operation and then detects at least one test operation signal to enable one or more desired testability functions. The desired test is performed in conjunction with or employing the enabled testability functions. Examples of such testability functions and desired tests are illustrated in Tables 1 and 2. Alternatively, a method of the present invention enables a test state machine with a first test signal. Then desired tests are performed based upon or responsive to stored test signals in conjunction with an output signal from the state machine. This method may be employed for an integrated circuit, or for a system consisting of a plurality of integrated circuits.

Many other variations and modifications may be made in the techniques and apparatus hereinabove described, by those having expertise in this technology, without departing from the concepts of the present invention. Accordingly, it should be clearly understood that the methods and apparatus depicted in the accompanying drawings and referred to in the foregoing description are illustrative only and are not intended as limitations on the scope of the invention.

What is claimed is:

1. An integrated circuit, comprising:

operation circuitry having nodes and external terminals for input and output of signals during normal operation, a test controller connected to at least a first one of said external terminals for receiving signals and for providing output signals during a test operation, a test register for containing signals representative of selected tests to be performed connected to said test controller and at least a second one of said external terminals and responsive to said output signals of said test controller for enabling selected tests, and wherein said test controller and test register are operable to enable said selected tests without disturbing normal operation of the operation circuitry.

2. The integrated circuit of claim 1, further comprising:

a plurality of individual test logic circuits connected to said test register, each said test logic circuit for performing one or more of said selected tests.

3. The integrated circuit of claim 2, wherein one of the plurality of individual test logic circuits connected to said test register is a DC parametric test circuit.

4. The integrated circuit of claim 1, further comprising:

a plurality of isolation means each respectively connected to a portion of said external terminals, including said at least a first one and at least a second one of said external terminals, for providing signals from said portion of external terminals to respective portions of nodes of said operation circuitry during normal operation, the plurality of isolation means further operable to retain pre-test-mode logic states applied to the operation circuitry such that the signals representative of selected tests can be provided to the test register without disturbing normal operation of the operation circuitry.

5. The integrated circuit of claim 4, wherein said isolation means further couple a pre-test signal of said respective external terminal to said operation circuitry during a test operation.

6. The integrated circuit of claim 1, further comprising, a dedicated test pin connected to said test controller.

7. The integrated circuit of claim 6, wherein a signal on said test pin controls said test controller to enable at least a preselected first portion of said selected tests.

8. The integrated circuit of claim 7, wherein signals on said test pin and said at least a first one of said external terminals control said test controller to enable at least a preselected second portion of said selected tests.

9. An integrated circuit, comprising:

operation circuitry, a plurality of test logic circuits interconnected with said operation circuitry, each circuit for performing at least one selected test on at least a portion of the operation circuitry, a test register for storing signals representative of said selected tests interconnected with said test logic circuits, and a multi-state controller connected to said test register for enabling one or more of said tests as a function of said signals stored in said test register without disturbing normal operation of the operation circuitry.

10. The integrated circuit of claim 9, wherein a first state of said multi-state controller enables at least a preselected first portion of said selected tests.

11. The integrated circuit of claim 9, wherein a second state of said multi-state controller allows for loading of signals into said test register.

12. The integrated circuit of claim 9, wherein a third state of said multi-state controller allows for restoring pre-test signals to said operation circuitry using preselected terminals used to provide signals to said multi-state controller during a test operation.

13. The integrated circuit of claim 12, wherein said third state further allows for restoring pre-test signals to said operation circuitry using preselected terminals used to provide signals to said test register during a test operation.

14. The integrated circuit of claim 9, wherein a fourth state of said multi-state controller enables at least a preselected second portion of said selected tests.

15. An integrated circuit test access port, comprising:
   a controller for detecting a first signal to start a test operation and for generating at least a first test signal, and
   a test register connected to said controller for storing signals representative of preselected testability functions and for enabling one or more of said preselected testability functions in functional relationship with such stored signals and said at least a first test signal.

16. A method of testing an integrated circuit, comprising:
   storing a plurality of signals within the integrated circuit without disturbing normal operation of the integrated circuit, wherein the plurality of signals are representative of a plurality of selected tests to be performed,
   detecting a first signal to shift to a test operation,
   enabling at least one stored signal when said first signal is detected, and wherein said at least one stored signal corresponds to at least one preselected test, and
   performing at least one preselected test on at least a portion of said integrated circuit.

17. The method of claim 16, wherein said at least one stored signal comprises signals for selecting one of a plurality of modules.

18. A method for testing an integrated circuit, comprising:
   storing a plurality of signals within the integrated circuit without disturbing normal operation of the integrated circuit, wherein the plurality of signals are representative of a plurality of selected tests to be performed,
   generating a first test signal to start a test operation,
   detecting at least one test operation signal to enable one or more desired testability functions, and
   performing a desired test in conjunction with said enabled testability functions.

19. The method of claim 18, comprising:
   generating a second test signal to start a second test operation,
   detecting at least a second test operation signal to enable one or more different testability functions, and
   performing a desired test in conjunction with said enabled different testability functions.

20. A method for testing an integrated circuit, comprising:
   storing a plurality of test signals within the integrated circuit without disturbing normal operation of the integrated circuit, wherein the plurality of test signals are representative of a plurality of selected tests to be performed,
   operating the integrated circuit for a first period of time,
   enabling a test state machine within the integrated circuit with a first test signal,
   performing a first test responsive to at least one stored test signal in conjunction with an output signal from said state machine without disturbing normal operation of the integrated circuit,
   resuming normal operation of the integrated circuit for a second period of time,
   enabling a test state machine with a second test signal, and
   performing a second test responsive to at least a second stored test signal in conjunction with an output signal from said state machine without disturbing normal operation of the integrated circuit.

21. The method of claim 20, wherein the step of performing a first test comprises performing a DC parametric test.

\* \* \* \* \*